US009250140B2

(12) United States Patent
Challener

(10) Patent No.: US 9,250,140 B2
(45) Date of Patent: Feb. 2, 2016

(54) SYSTEMS AND METHODS FOR MULTIPLEXING SENSORS ALONG A CABLE

(71) Applicant: General Electric Company, Schenectady, NY (US)

(72) Inventor: William Albert Challener, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 14/226,062

(22) Filed: Mar. 26, 2014

(65) Prior Publication Data

US 2015/0276507 A1    Oct. 1, 2015

(51) Int. Cl.

| G01N 21/55 | (2014.01) |
| G01K 11/32 | (2006.01) |
| G01L 11/02 | (2006.01) |
| G01V 8/10 | (2006.01) |
| B81B 7/02 | (2006.01) |

(52) U.S. Cl.
CPC . *G01K 11/32* (2013.01); *B81B 7/02* (2013.01); *G01L 11/025* (2013.01); *G01V 8/10* (2013.01)

(58) Field of Classification Search
USPC .......................... 356/445–448, 450, 477, 478
See application file for complete search history.

(56) References Cited

U.S. PATENT DOCUMENTS

| 7,362,422 | B2 | 4/2008 | DiFoggio et al. |
| 8,253,945 | B2 | 8/2012 | Gahan et al. |
| 8,256,298 | B2 | 9/2012 | Suijlen et al. |
| 8,429,978 | B2 | 4/2013 | Klosinski et al. |
| 2009/0091765 | A1* | 4/2009 | Chow et al. ................... 356/477 |
| 2010/0154553 | A1 | 6/2010 | Phan Le et al. |
| 2010/0189444 | A1 | 7/2010 | Vernooy et al. |
| 2013/0070235 | A1 | 3/2013 | Chen et al. |

FOREIGN PATENT DOCUMENTS

EP    2131159 A1    12/2009

OTHER PUBLICATIONS

International Search Report and Written Opinion issued in connection with corresponding PCT Application No. PCT/US2015/014419 dated May 8, 2015.

(Continued)

*Primary Examiner* — Tri T Ton
(74) *Attorney, Agent, or Firm* — John P. Darling

(57) ABSTRACT

A wavelength assignment system in one embodiment includes an upstream port, a sensor port, and a downstream port. The upstream port is configured to receive a transmitted signal including a drive component and a read component comprising individual read channel components at corresponding individual read wavelengths. The sensor port is configured to provide a sensor component of the transmitted signal including a sensor portion of the drive component and substantially all of an individual read channel component to a sensor. The downstream port is configured to provide a downstream component including a downstream portion of the drive component and at least one additional read channel component of the transmitted signal to at least one additional sensor disposed downstream of the sensor. The wavelength assignment system is configured to receive the transmitted signal and separate the transmitted signal into the sensor component and the downstream component.

16 Claims, 6 Drawing Sheets

(56) References Cited

OTHER PUBLICATIONS

Blair et al., "Wavelength Division Multiplexed Sensor Network Using Bragg Fibre Reflection Gratings", Electronics Letters, vol. No. 28, Issue No. 18, pp. 1734-1735, Aug. 27, 1992.

Wilson et al., "An Optical Network of Silicon Micromachined Sensors", Miniaturized Systems With Micro-Optics and Micromechanics. San Jose, [Proceedings of SPIE], vol. No. 2687, pp. 78-88, Jan. 30, 1996.

Hernandez-Lorenzo et al., "Single and Double Distributed Optical Amplifier Fiber Bus Networks with Wavelength Division Multiplexing for Photonic Sensors", Journal of Lightwave Technology, IEEE Service Center, vol. No. 16, Issue No. 4, pp. 485-489, Apr. 1, 1998.

* cited by examiner

SYSTEMS AND METHODS FOR MULTIPLEXING SENSORS ALONG A CABLE

STATEMENT REGARDING FEDERALLY SPONSORED RESEARCH AND DEVELOPMENT

This invention was made with government support under Government Contract Number DE-FE0010116. The U.S. Government may have certain rights in this invention.

BACKGROUND

Various devices have been developed for measuring environmental conditions of a given location, such as temperature or pressure. However, numerous locations present challenges to many of these devices. For example, many devices may not be appropriate for use in higher temperature environments, such as geothermal wells, oil wells, or the like.

Certain sensors may be appropriate for use in such challenging environments. Micro-electromechanical system (MEMS) sensors have been utilized, for example, to measure pressure in challenging environments such as geothermal wells. A relationship between a resonant frequency of a MEMS sensor and the pressure may be utilized to measure pressure, for example. Such sensors may be conventionally interrogated using a first laser modulated at the resonant frequency of the sensor, and using a second laser to provide a generally constant light level at a different wavelength for measuring the vibration amplitude of the sensor.

Such conventional approaches may suffer from one or more drawbacks. For example, a feedback mechanism for modulating a laser at the resonant frequency of the sensor may be quite complex, expensive, and/or inconvenient to use. As another example, conventional approaches may not lend themselves to use with multiple sensors disposed in a remote location, such as a well. For example, conventional approaches may require the use of two lasers per sensor, which may result in considerable expense to provide and maintain a system using multiple sensors. As another example, approaches merely utilizing splitting device to distribute energy among sensors may result in high power requirements for read lasers and/or poor signal quality.

BRIEF DESCRIPTION

In one embodiment, a wavelength assignment system is provided that includes an upstream port, a sensor port, and a downstream port. The upstream port is configured to receive a transmitted signal sent from an upstream location to a downstream location and to provide a reflected signal of at least a portion of the transmitted signal. The transmitted signal includes light from a plurality of lasers. The transmitted signal includes a drive component at a drive wavelength and a read component comprising individual read channel components at corresponding individual read wavelengths. The sensor port is disposed downstream of the upstream port and is configured to provide a sensor component of the transmitted signal to a sensor and to receive a reflection of at least a portion of the sensor component from the sensor. The sensor component includes a sensor portion of the drive component and substantially all of an individual read channel component of the read component corresponding to the sensor. The downstream port is disposed downstream of the upstream port and is configured to provide a downstream component of the transmitted signal to at least one additional sensor disposed downstream of the sensor, and to receive a reflection signal of at least a portion of the downstream component from the at least one additional sensor. The downstream component includes a downstream portion of the drive component and substantially all of at least one additional read channel component corresponding to the at least one additional sensor. The wavelength assignment system is configured to receive the transmitted signal and separate the transmitted signal into the sensor component and the downstream component.

In another embodiment, a measurement system is provided that includes a laser source module, a plurality of sensors, and a wavelength assignment system. The laser source module includes a drive laser and a plurality of read lasers, and is configured to provide an output of the drive laser and the plurality of read lasers via a shared cable in a downstream direction. The plurality of sensors are operably coupled to the shared cable. Each of the sensors is disposed downstream of the laser source and configured to receive an output of a corresponding read laser. The wavelength assignment system is operably coupled to the shared cable, and is configured to receive a transmitted signal including a drive component at a drive wavelength and a read component comprising individual read channel components at corresponding individual read wavelengths from the laser source module. The wavelength assignment system is also configured to separate the transmitted signal into a sensor component and a downstream component, to provide the sensor component to a dedicated sensor of the plurality of sensors associated with the wavelength assignment system, and to provide the downstream component to at least one additional sensor disposed downstream of the wavelength assignment system. The wavelength assignment system includes an upstream port, a sensor port, and a downstream port. The upstream port is configured to receive the transmitted signal from the laser source module and to provide a reflected signal of at least a portion of the transmitted signal to the laser source module. The sensor port is disposed downstream of the upstream port and is configured to provide the sensor component of the transmitted signal to the dedicated sensor and to receive a reflection of at least a portion of the sensor component from the dedicated sensor. The sensor component includes a sensor portion of the drive component and substantially all of an individual read channel component of the read component corresponding to the dedicated sensor. The downstream port is disposed downstream of the upstream port and is configured to provide a downstream component of the transmitted signal to the at least one additional sensor, and to receive a reflection signal of at least a portion of the downstream component from the at least one additional sensor. The downstream component includes a downstream portion of the drive component and substantially all of at least one additional read channel component corresponding to the at least one additional sensor.

In another embodiment, a method is provided that includes receiving a transmitted signal from an upstream location. The transmitted signal includes a drive component at a drive wavelength and a read component comprising individual read channel components at corresponding individual read wavelengths. The method also includes separating, with a wavelength assignment system, the transmitted signal into a sensor component and a downstream component. The sensor component includes a sensor portion of the drive component and substantially all of an individual read channel component of the read component corresponding to a sensor. The downstream component includes a downstream portion of the drive component and substantially all of at least one additional read channel component corresponding to at least one additional sensor disposed downstream of the sensor. Also, the method includes providing the sensor component to the sensor and providing the downstream component to the at least one additional sensor disposed downstream of the sensor.

DETAILED DESCRIPTION

Figure 1:
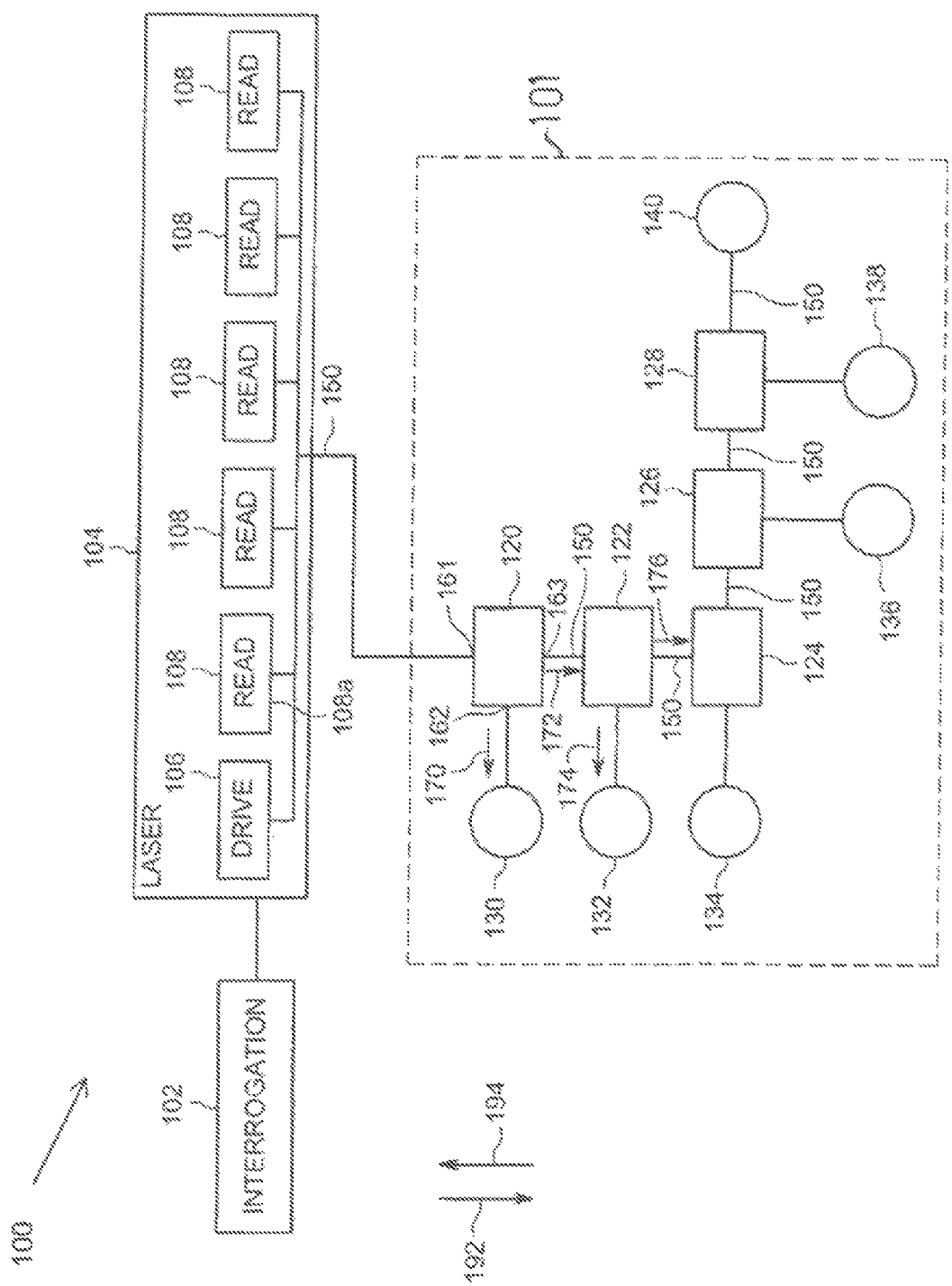
FIG. 1 is a schematic block diagram of a measurement system in accordance with various embodiments.

Various embodiments will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (e.g., processors, controllers or memories) may be implemented in a single piece of hardware (e.g., a general purpose signal processor or random access memory, hard disk, or the like) or multiple pieces of hardware. Similarly, any programs may be stand-alone programs, may be incorporated as subroutines in an operating system, may be functions in an installed software package, and the like. It should be understood that the various embodiments are not limited to the arrangements and instrumentality shown in the drawings.

As used herein, the terms "system," "unit," or "module" may include a hardware and/or software system that operates to perform one or more functions. For example, a module, unit, or system may include a computer processor, controller, or other logic-based device that performs operations based on instructions stored on a tangible and non-transitory computer readable storage medium, such as a computer memory. Alternatively, a module, unit, or system may include a hard-wired device that performs operations based on hard-wired logic of the device. The modules or units shown in the attached figures may represent the hardware that operates based on software or hardwired instructions, the software that directs hardware to perform the operations, or a combination thereof. The hardware may include electronic circuits that include and/or are connected to one or more logic-based devices, such as microprocessors, processors, controllers, or the like. These devices may be off-the-shelf devices that are appropriately programmed or instructed to perform operations described herein from the instructions described above. Additionally or alternatively, one or more of these devices may be hard-wired with logic circuits to perform these operations.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Generally, various embodiments provide devices, systems, and/or methods for interrogating sensors such as micro-electromechanical system (MEMS) sensors. Various embodiments may be utilized in conjunction with interrogating one or more MEMS sensors remotely positioned in a well, for example a geothermal well, a well used in conjunction with oil or gas exploration or extraction, or a well used in conjunction with hydraulic fracturing, as examples. For additional details regarding MEMS sensors and the use of MEMS sensors, for example, to detect one or more measurands such as temperature or pressure, see U.S. 2015 /0033841 A1, the entire subject matter of which is hereby incorporated in its entirety. In some embodiments, plural sensors (e.g., MEMS sensors) may be coupled to a single shared cable. A separate laser wavelength may be used to read each sensor, with laser energy for each wavelength inserted or provided into the shared cable, with individual wavelengths separated along with a portion of drive signal at or near each sensor for use with the particular sensor. As used herein, a "laser wavelength" may he understood as including a relatively narrow bandwidth centered about a nominal value. For example, a laser wavelength of about 1310 nanometers may be understood as a wavelength channel including laser energy within a relatively narrow range (e.g., plus or minus about 2 or 3 nanometers). As used herein, to read a signal or portion thereof may be understood as including collecting information, over at least one sampling period of the signal or portion thereof. For example, reflections of a read signal (or reflections of a portion of a read signal) from a sensor may be collected and stored over a number of samples, with the results averaged or otherwise combined.

As discussed herein, if conventional splitting devices (e.g., devices that split off a specified percentage of light energy irrespective of wavelength) are used to divide the transmitted signal for use with a plurality of sensors, the amount of reflected light returned from the sensors may be a relatively small percentage of the light transmitted to the sensors, which may require relatively large intensities for read lasers, and/or result in a weak return signal and poor quality, for example due to a relatively low signal to noise ratio.

Various embodiments utilize different wavelengths for reading each sensor. In some embodiments, multiple read lasers may be employed (one for each sensor), while in other embodiments, a single wavelength-tunable laser may be utilized. As wavelength multiplexing may be performed only for read signals and reflections, a single drive laser may be employed. The drive laser may be a non-tunable, relatively high power laser at a given wavelength. For example, between about 1-20 milliWatts may be required to drive each sensor. Because laser diodes with output powers exceeding about 200 milliWatts are readily available, the power from a single drive laser may be readily shared among a number of sensors. In various embodiments, the portion of a signal contributed by a drive laser may be split or shared among sensors, while each sensor receives an additional read component contributed by a read laser dedicated to the particular sensor (and returns a reflection of the read component).

Various embodiments reduce the number of lasers or other devices required to drive and read one or more sensors. Various embodiments enable the use of wavelength division multiplexing allowing multiple sensors to he operably coupled to a single shared fiber optic. Additionally or alternatively, various embodiments provide simultaneous measurement of multiple resonant frequencies of a sensor die, permitting simultaneous determination of both pressure and temperature, as further discussed in U.S. 2015/0033841 A1. Various embodiments allow for the full (or nearly full) power of each read laser to be directed and recovered from a dedicated sensor connected to the read lasers via an optical fiber.

At least one technical effect of various embodiments includes reducing equipment (e.g., number of lasers and related equipment). At least one technical effect of various embodiments includes reduced energy requirements for read lasers. At least one technical effect of various embodiments includes improved signal quality (e.g., signal to noise ratio) for multiple sensors coupled to a shared optical fiber. At least one technical effect of various embodiments includes providing for use of a single cable with multiple sensors. At least one technical effect of various embodiments includes improved reliability and/or reduced cost of measuring parameters (e.g., temperature and pressure) in challenging remote environments.

FIG. 1 is a schematic view of a measurement system 100 formed in accordance with various embodiments. The measurement system 100 may be used to measure environmental conditions (e.g., one or more of temperature or pressure) at one or more locations disposed within a remote environment 101. The remote environment 101 may, for example, be a well used in oil or natural gas applications. The measurement system 100 includes an interrogation unit 102, a laser module 104, wavelength assignment systems 120, 122, 124, 126, 128, sensors 130, 132, 134, 136, 138, 140, and a cable 150. In the illustrated embodiment, the wavelength assignment systems 120, 122, 124, 126, 128, sensors 130, 132, 134, 136, 138, 140, and at least a portion of the cable 150 are disposed within the remote environment 101, with the sensors 130, 132, 134, 136, 138, 140 used to determine one or more environmental conditions or states (e.g., pressure, temperature) of the remote environment 101, while the interrogation unit 102 and the laser module 104 are disposed outside of the remote environment 101, thus preventing the interrogation unit 102 and the laser module 104 from harsh conditions of the remote environment 101. The interrogation unit 102 and the laser module 104 thus may be understood as being located remotely from the wavelength assignment systems 120, 122, 124, 126, 128 and the sensors 130, 132, 134, 136, 138, 140 (and vice versa). It may be noted that one or more aspects of the interrogation unit 102 and laser module 104 may be shared as part of a common unit or device.

Generally, for the illustrated embodiment, the interrogation unit 102 is configured to control the laser module 104 to provide a transmitted signal to the sensors 130, 132, 134, 136, 138, 140 via the cable 150. The depicted laser module 104 includes a drive laser module 106 and plural read laser modules 108. The drive laser module 106 is configured to provide a drive component of the transmitted signal, while the read leaser modules 108 are configured to each provide an individual read channel component of a read component of the transmitted signal. Each read laser module 108 may produce a read laser signal at a specified wavelength, with each wavelength provided to and used to read a particular one of the sensors 130, 132, 134, 136, 138, 140. In the depicted embodiment, each sensor may be understood as being dedicated to a particular read laser (and vice versa). Further, each read laser module 108 may be configured to read reflections received from a particular sensor dedicated thereto.

The laser module 104 is configured to combine the individual read channel components into a read component, and to combine the read component and the drive component to provide a transmitted signal that is transmitted downstream via the cable 150 to the wavelength assignment systems and sensors. Downstream and upstream directions as used herein are defined relative to signals transmitted from a laser or other light source and reflections provided responsive to the transmitted signals. As shown in FIG. 1, a downstream direction 192 corresponds to the direction traveled by transmitted signals, and an upstream direction 194 corresponds to the direction traveled by reflections from the sensors.

The laser module 104 in the illustrated embodiment is configured to provide laser or light energy (e.g., from the drive and read lasers) to the sensors 130, 132, 134, 136, 138, 140 via the cable 150. The depicted laser module 104 is also configured to receive reflections of the read signals from the sensors via the cable 150. For example, the laser module 104 may include one or more detectors (e.g., one detector per sensor) that receive the reflections corresponding to the wavelength associated with a given laser/sensor/detector combination. The laser module 104 may also include circulators, dividing modules, or the like to separate the returned combined reflection signals into portions corresponding to particular sensors, and transmit portions of the reflected signal corresponding to particular sensors to the appropriate corresponding detector. The detectors may then provide the reflections (either raw or processed) to the interrogation unit 102. In other embodiments, the detector(s) may be understood as part of the interrogation unit 102.

The drive component (e.g., a signal produced by the drive laser module 106) may be delivered to drive or excite the sensors to resonate, while the read component may be employed to determine one or more characteristics of the sensors, such as one or more resonant frequencies. The interrogation unit 102 also receives reflections from the sensors, either directly or indirectly (e.g., via the laser module 104 as shown in FIG. 1). The interrogation unit 102 reads the reflections (reading a signal as used herein may be understood as including collecting or obtaining information during one or more sampling periods for later use or analysis) to derive or determine one or more resonant frequencies of the sensors, which may be used by the interrogation unit 102 (or other processing unit) to determine temperature and/or pressure at a plurality of locations within the remote environment 101 corresponding to the locations of the sensors 130, 132, 134, 136, 138, 140.

Generally, the wavelength assignment systems 120, 122, 124, 126, and 128 are configured to receive the signal transmitted from the laser module 104 (or a portion thereof) via the cable 150, and to separate the received signal into two components, with one component being provided to a sensor dedicated to the particular wavelength assignment system, and the other component provided to one or more additional sensors disposed downstream of the particular wavelength assignment system.

It may be noted that the components provided by the wavelength assignment systems are not identically divided as the drive component and the read component of the transmitted signal. Rather, aspects of each of the drive component and the read component are present in each of the components transmitted downstream by the wavelength assignment system. For example, in the illustrated embodiment, each wavelength assignment system may be configured to provide a sensor component of a received signal to a dedicated sensor, with the sensor component including a sensor portion of the drive component (e.g., a specified percentage of the drive component) and substantially all of an individual read channel component corresponding to the sensor. As used herein, substantially all of a signal or substantially an entire component of a signal may be understood to mean all or nearly all of a given component, or an amount practically achievable based on losses associated with available equipment. As one example, use of a conventional coarse wavelength division multiplexer (CWDM) to separate a nominal wavelength may be understood as providing substantially all of a component having the nominal wavelength. In the illustrated embodiment, each sensor may receive a percentage of the drive component as well as a specific portion of the read component based on wavelength (e.g., a read channel component from a particular read laser dedicated to the sensor).

It may further be noted that the wavelength assignment systems are not configured merely as simple splitters or couplers that provide a percentage of the total signal received to a sensor and the remaining percentage downstream, as use of simple splitters or couplers may result in undesirably large power requirements for read lasers and/or undesirable signal or noise characteristics of reflected signals received by the interrogation unit 102. For instance, in one example scenario utilizing simple splitters or couplers, ten sensors may be operably coupled to a cable, with each sensor to receive about 10% of a total signal transmitted. If simple splitter devices are used to provide portions of the total signal without respect to wavelength to the sensors, the first sensor (e.g., the sensor disposed furthest upstream) may be associated with a 90/10 splitter configured to provide 10% of the total signal to the sensor and the remaining 90% downstream for further division among the 9 downstream sensors. The second sensor (e.g., the sensor disposed immediately downstream of the first sensor) may then be associated with a 11.1/88.9 splitter configured to provide 11.1% of a total received signal to the sensor (so that the sensor receives 11.1% of the 90% of the original signal transmitted downstream from the first sensor, or about 10% of the total signal) and to direct 88.9% of the signal received by the second sensor downstream, and so on.

Accordingly, the first sensor will receive about 10% of the total signal. However, the reflected signal from the first sensor must also be transmitted through the 90/10 splitter associated with the first sensor to be joined with other reflected signals and provided upstream to an interrogation unit. As the reflected signal passes through the 90/10 splitter, the reflected signal is diluted again, with only 10% of the reflected signal provided upstream, with the remaining 90% absorbed within the 90% splitter. (To return the remaining 90% of the reflected signal upstream would require an additional cable, increasing cost and complexity of the system). Because the signal provided to the first sensor was only about 10% of the original strength, and because the reflections provided upstream from the first sensor are only about 10% of the reflections, the strength of the reflected signal may be seen to be about 1% or less (as 10% of 10% is 1%) of the original signal strength. Similarly, the reflections for each of the downstream sensors may provide reflected signals having about 1% or less of the strength of the originally transmitted read signal for each sensor. To provide an adequate reflected signal, the originally transmitted read signal for the first sensor must therefore by about 100 times the intensity of the desired intensity of the reflected signal from the first sensor. Such powers for read lasers may be impractical to achieve. (It may be noted that the passage of a signal through a splitter or coupler twice may be of greater concern for read lasers than drive lasers, as the reflections of drive lasers may be disregarded and not used to determine sensor properties in some embodiments).

Accordingly, in various embodiments, the wavelength assignment systems are not configured as simple splitters or couplers. (It may be noted that the wavelength assignment systems may include, among other aspects or components, one or more splitters or couplers, but that the overall system does not merely act as a splitter that splits off a percentage of an entire signal irrespective of wavelength.) Instead, the depicted wavelength assignment systems selectively separate various aspects of the transmitted signal to provide all or substantially all of a given read wavelength to a corresponding sensor and a portion of the drive component to the corresponding sensor.

As indicated above, aspects of each of the drive component and the read component are present in each of the components transmitted downstream by the wavelength assignment system. For example, in the illustrated embodiment, each wavelength assignment system may be configured to provide a sensor component of a received signal to a dedicated sensor, with the sensor component including a sensor portion of the drive component (e.g., a specified percentage of the drive component) and substantially all of an individual read channel component corresponding to the sensor. In the illustrated embodiment, each sensor may receive a percentage of the drive component as well as a specific portion of the read component based on wavelength (e.g., a read channel component from a particular read laser dedicated to the sensor). The wavelength assignment systems are further configured to receive a first reflection signal including reflections of read signals from downstream sensors, to receive a second reflection signal including reflections from the sensor dedicated to the particular wavelength assignment system, combine the first and second reflection signals, and provide the combined reflection signal upstream.

The wavelength assignment system 120 depicted in FIG. 1 includes an upstream port 161, a sensor port 162, and a downstream port 163. (The other wavelength assignment systems 122, 124, 126, 128 may be configured generally similarly.) As used herein, a port may be understood to be a device, aspect, component or feature used to communicably couple a wavelength assignment system (or a portion thereof) with an external device (e.g., a sensor, a different wavelength assignment system, a multiplexer, a cable, or the like). The port may be configured, by way of example, as one or more cables extending from the wavelength assignment system, or as a connection point or feature configured to couple with (e.g., via a soldered connection with a fiber) or otherwise accept one or more cables (e.g., via one or more of a socket, plug, or other connector), among others.

The wavelength assignment system 120 receives a transmitted signal from the laser module 106, with the transmitted signal including a drive component (from a drive laser) and a read component (from read lasers). The wavelength assignment system 120 separates the transmitted signal into a sensor component 170 (including a portion of the drive component and substantially all of the signal from one of the read lasers) and a downstream component 172 (including the remainder of the drive component and the remainder of the signals from other read lasers). For example, the wavelength assignment system 120 may separate a predetermined percentage of the drive component for inclusion in the sensor component 170, and identify a read signal from a particular read laser based on wavelength for inclusion in the sensor component 170. In the illustrated embodiment, with the sensor 130 associated with the wavelength assignment system 120 positioned as the farthest upstream of six sensors, the wavelength assignment system 120 may split off about 1/6 of the drive component of the transmitted signal from the laser module 104 for inclusion in the sensor component 170. In the illustrated embodiment, for example, the read laser module 108*a* may be assigned to the sensor 130, and the wavelength assignment system 120 may separate all of the transmitted signal at the wavelength dedicated to the read laser module 108*a* and the sensor 130 for inclusion in the sensor component 170. The sensor component 170 is transmitted to the associated sensor 130 via the sensor port 162, and the drive component 172 is transmitted to the wavelength assignment system 122 (the adjacent downstream wavelength assignment system relative to the wavelength assignment system 120). Reflections from the sensor 130 may be returned to the wavelength assignment system 120 via the sensor port 162, and returned from the wavelength assignment system 120 to the laser module 104 (and/or interrogation unit 102) via the upstream port 161.

The downstream component 172 produced by the wavelength assignment system 120 is provided to the wavelength assignment system 122, and may be understood as the transmitted signal received by the wavelength assignment system 122. The wavelength assignment system 122 may be configured generally similar to the wavelength assignment system 120, with the signal 172 received by the wavelength assignment system 122 separated into a sensor component 174 and a downstream component 176 by the wavelength assignment system 120. The sensor component 174 may include, for example, a given percentage of the drive component of the signal originally transmitted from the laser module (e.g., about 1/6), as well as the entire signal from a particular read laser associated with the sensor 132 based on wavelength.

As the signal is transmitted downstream via the cable 150, each wavelength assignment system may separate a sensor component for a sensor associated with the wavelength assignment system and transmit a downstream component to any sensors located downstream. It may be noted that the last (furthest downstream) wavelength assignment system 128 may transmit a sensor component to the sensor 138 and a downstream component directly to the sensor 140, as the remaining portion of the transmitted signal not already separated as a sensor component for one of the upstream sensors (e.g., the downstream component of the wavelength assignment system 128) may include only portions of the signal for use by the sensor 140. Thus, for a total of n sensors (where n is an integer greater than 1) and n read lasers (with each read laser configured for or dedicated to a given sensor) a total of n−1 wavelength assignment systems may be employed.

The sensors 130, 132, 134, 136, 138, 140 receive the signal transmitted by the laser module 104 and provide reflections of the read signals responsive to receiving the transmitted signal. The reflections may be used to identify resonant frequencies or modes of the sensors, which may in turn be used to determine an environmental parameter of the remote environment 101, such as a pressure and/or temperature of a location within the remote environment 101 proximate a given sensor.

The sensors, for example, may be configured as MEMS sensors. (For additional details regarding MEMS sensors, see U.S. 2015/0033841A1.) Generally, in various embodiments, a sensor may be configured to have two or more distinct resonant frequencies, or modes. Depending on the temperature and pressure of the environment in which the sensor is disposed, the first and second resonant frequencies may vary. Additionally, the type, direction, and/or amount of variance of the resonant frequencies with respect to changes in temperature and pressure may differ from each other. As one example, a first resonant frequency may increase with an increase in temperature while a second resonant frequency may decrease with an increase in temperature. As another example, each of a first and second resonant frequencies may increase (or decrease) with an increase in temperature, but the first resonant frequency may increase (or decrease) at a higher rate with temperature change than the second resonant frequency. As one more example, the type or shape of variance with temperature change may differ. For example, a first resonant frequency may vary linearly with temperature change, while a second resonant. frequency may vary non-linearly with temperature change. Because the variabilities (or changes in resonant frequency) differ for the first and second resonant frequencies, different combinations of first and second resonant frequencies may correspond to and define particular combinations of pressure and temperature. It may be noted that in other embodiments, only one resonant frequency may be determined, and used, for example, to determine a pressure.

The cable 150 is configured to provide a conduit for passage of the signal from the laser module 104 (or portions thereof) to the sensors, and for passage of the reflections from the sensors to the laser module 104 and/or the interrogation unit 102. The cable 150, for example, may be a fiber optic cable. The fiber optic may be provided within a casing, and may be disposed in a protective shield or casing, such as ¼" stainless steel tube, to protect the cable 150 from harsh conditions within the remote environment 101. An internal sleeve and/or a gel, liquid, or other material may be interposed between the cable 150 and the stainless steel tube. The wavelength assignment systems 120, 122, 124, 126, 128 may be spliced into the cable 150 at predetermined locations corresponding to locations along the cable 150 for which environmental parameters (e.g., temperature, pressure) will be sensed or detected.

In the embodiment depicted in FIG. 1, each read laser is associated with a corresponding detector and sensor based on wavelength. By associating each signal with the detector from which the signal was obtained, each signal (and any related parameters such as temperature and pressure determined using each signal) may be associated with the sensor corresponding or assigned to the identified detector. With each sensor associated with a unique wavelength of reflections, the sensors may be distributed about a shared cable while still allowing for ready identification of portions of signals corresponding to each sensor, eliminating the need for separate cables for each sensor. It may be noted that while only six sensors are shown, the general principles discussed herein may be applied to embodiments having different numbers of sensors, and that different numbers of sensors operably coupled to a single cable may be employed in various embodiments. Further, by splitting only the drive component irrespective of wavelength and separating the read components based on wavelength, a single relatively high power drive laser may be shared among sensors, while relatively low power read lasers may be employed.

Figure 2:
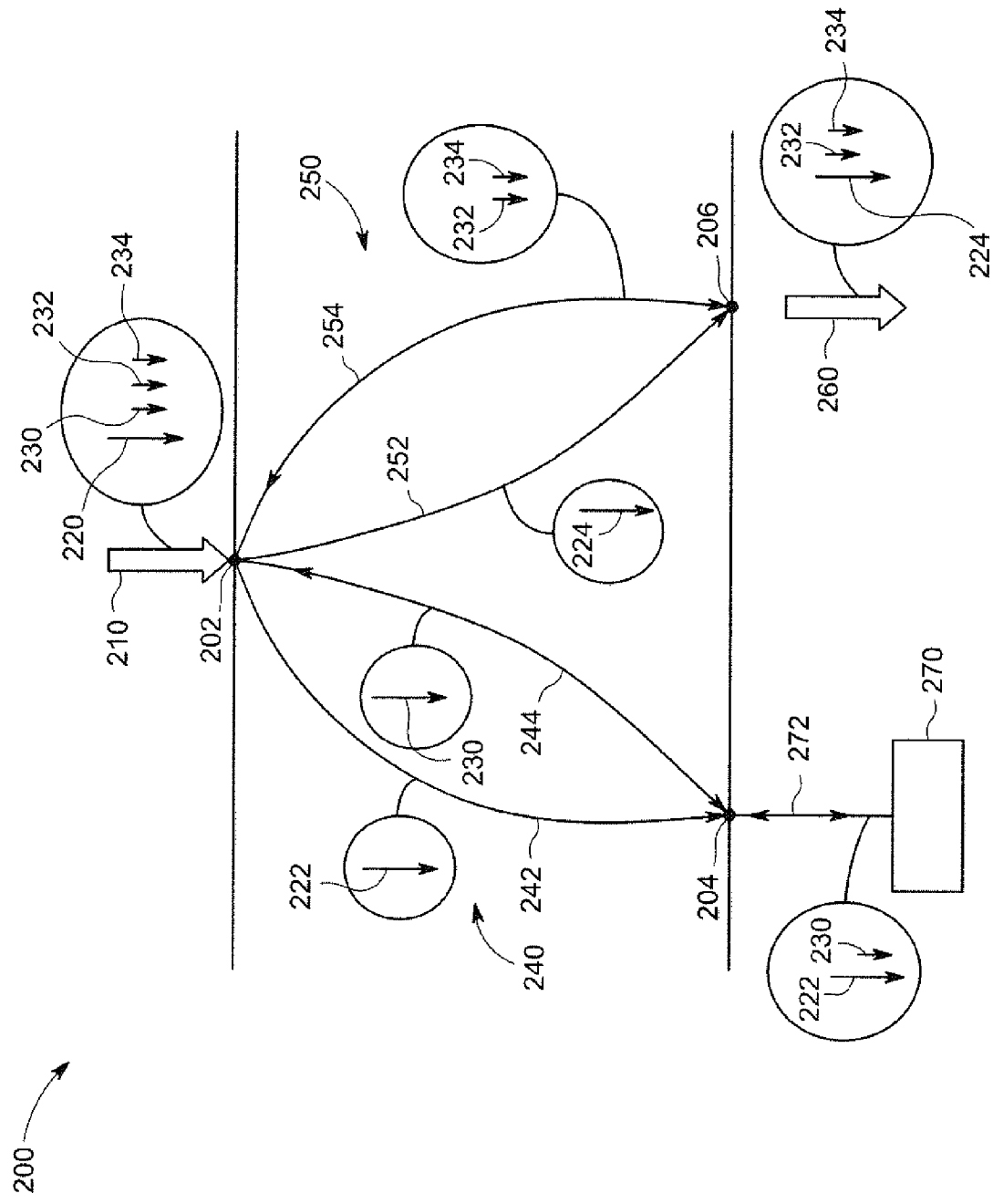
FIG. 2 is a schematic block diagram of a wavelength assignment system in accordance with various embodiments.

FIG. 2 is a schematic view of a wavelength assignment system 200 formed in accordance with various embodiments. The wavelength assignment system 200 may be utilized, for example, as one of the wavelength assignment systems 120, 122, 124, 126 discussed in connection with FIG. 1. The wavelength assignment system 200 includes paths having branches interposed between the ports, with different components or aspects of a received signal being separated and passed through the wavelength assignment system 200 via the various paths and branches.

The wavelength assignment system 200 is configured to receive a transmitted signal 210, and to separate the transmitted signal 210 into a sensor component 272 and a downstream component 260. The wavelength assignment system 200 includes an upstream port 202, a sensor port 204, and a downstream port 206. The wavelength assignment system 200 includes a sensor path 240 extending between the upstream port 202 and the sensor port 204, and a downstream path 250 extending between the upstream port 202 and the downstream port 206. The sensor component 272 is provided to a sensor 270 via the sensor port 204, and the downstream component 260 is provided downstream of the wavelength assignment system 200 (e.g., toward one or more sensors disposed downstream of the wavelength assignment system 200). The various paths and branches may have one or more of splitter modules, divider modules, or the like disposed therealong to direct portions of signals thorough the various paths and branches (see, e.g., FIGS. 3 and 4 and related discussion for examples of modules configured to direct portions of signals along various paths and branches).

As seen in FIG. 2, the signal 210 that is received at the upstream port 202 includes a number of components, namely a drive component 220, a first read channel component 230, a second read channel component 232, and a third read channel component 234. The read channel components are transmitted at different wavelengths, and each configured for use by a particular sensor. In the illustrated embodiment, the first read channel component 230 is produced at a wavelength dedicated to the sensor 270.

The sensor path 240 includes a sensor drive branch 242 and a sensor read branch 244, and the downstream path 250 includes a downstream drive branch 252 and a downstream read branch 254. After the signal 210 is received at the upstream port 202, a sensor portion 222 of the drive component 220 is separated from the signal 210 and directed down the sensor drive branch 242 of the sensor path 240. The remainder of the drive component 220 is directed as a downstream portion 224 down the downstream drive branch 252 toward the downstream port 206. For example, if the sensor 270 is the farthest upstream of three total sensors, the sensor portion 222 of the drive component 220 may be about ⅓ of the total drive component 220, and the downstream portion 224 may be about ⅔ of the total drive component 220. The sensor portion 222 and the downstream portion 224 may be obtained from the drive component 220, for example, via a splitting module (e.g., a module that divides a signal into two proportions irrespective of wavelength).

Further, after the signal 210 is received at the upstream port 202, a sensor portion of the read component is separated from the signal 210 (e.g., signal 230 is separated from signals 232, 234) and directed down the sensor read branch 224 of the sensor path 240. The remainder of the read component (e.g., signals 232, 234) is directed down the downstream read branch 254 of the downstream path 250. In the illustrated embodiment, the first read channel component 230, which is at a wavelength dedicated to the sensor 270, is separated from the other read channel components 232, 234, and directed down the sensor read branch 244 to the sensor port 204, while the remaining read channel components 232, 234 are directed down the downstream read branch 254 to the downstream port 206. The first read channel component 230 may be separated from the other read channel components, for example, via a dividing module such as a wavelength division multiplexer (WDM) configured to separate a portion of a signal at the wavelength assigned to the sensor 270.

The signal from the sensor read branch 244 (e.g., first read channel component 230) may be combined with the signal from the sensor drive branch 242 (e.g., the sensor component 222 of the drive component 220) and transmitted to the sensor 270 via the sensor port 204 as the sensor component 272. The wavelength assignment system 200 may also receive reflections of the first read channel component 230 from the sensor 270.

Similarly, the signals from the downstream read branch 254 (e.g., signals 232, 234) may be combined with the signal from the downstream drive branch 252 (e.g., downstream component 224 of the drive component 220) and transmitted in the downstream direction to one or more additional wavelength assignment systems sensors as the downstream component 260. Further, the wavelength assignment system 200 may receive reflections of the read channel components 232, 234 from sensors disposed downstream of the wavelength assignment system 200. The various reflections may be directed along the read branches to the upstream port 202, and from the upstream port 202 to one or more detectors.

Figure 3:
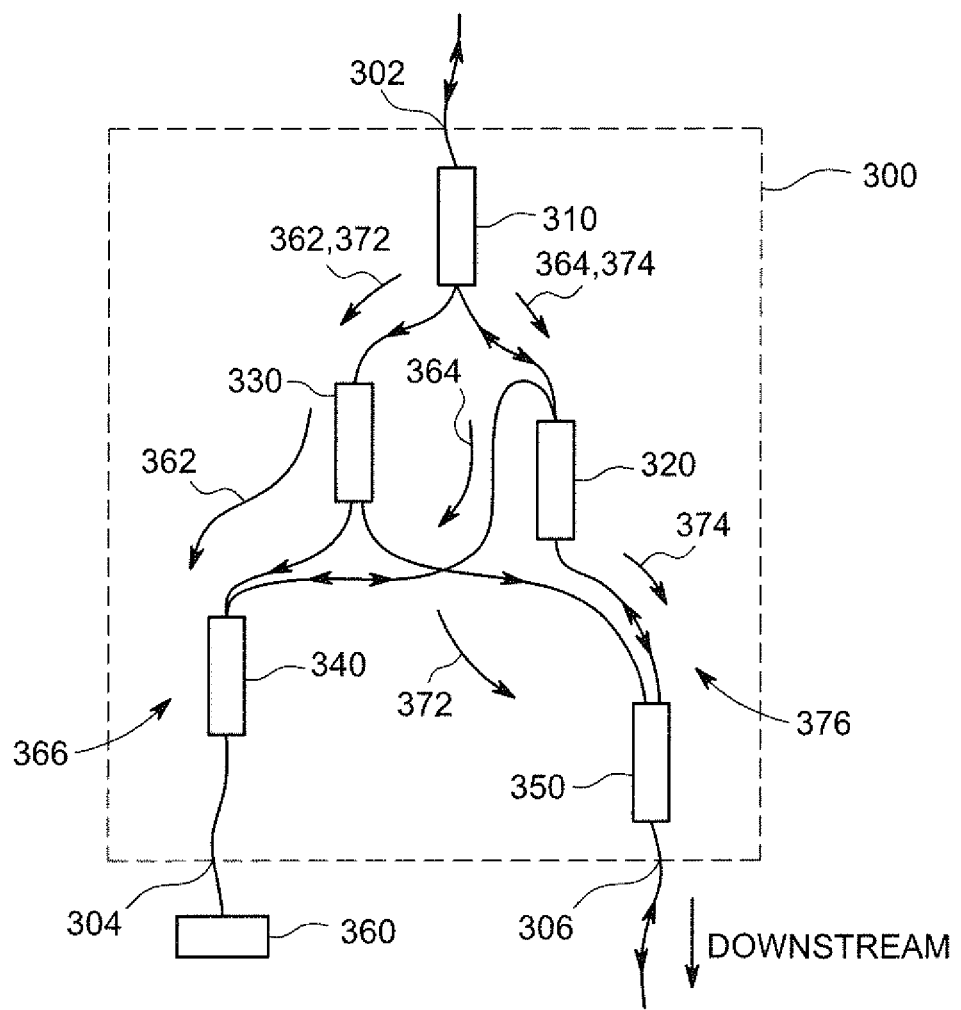
FIG. 3 is a schematic block diagram of a wavelength assignment system in accordance with various embodiments.

FIG. 3 is a schematic view of a wavelength assignment system 300 formed in accordance with various embodiments. The wavelength assignment system 300 may be utilized, for example, as one of the wavelength assignment systems 120, 122, 124, 126 discussed in connection with FIG. 1. The wavelength assignment system 300 includes both splitting modules and dividing modules that direct components of a received signal toward ports via paths and/or branches of paths. As used herein, a splitter or splitting module splits a percentage of total light without respect to wavelength. A conventional splitter or coupler provide an example of a splitting module. As used herein, a divider or dividing module selectively separates wavelengths of light based on wavelength (e.g., components having wavelengths above and below a given wavelength may be separated from each other, or wavelengths of a particular band may be separated from other bands). A WDM provides an example of a dividing module. It may be noted that, as used herein, a joining of two components may be understood as the reverse of dividing, so that a particular module or component may be viewed as a dividing module in one direction (e.g., downstream) and as a joining module in the opposite or reverse direction (e.g., upstream).

The wavelength assignment system 300 includes an upstream port 302, a sensor port 304, and a downstream port 306. The wavelength assignment system 300 is configured to separate a signal received at the upstream port (e.g., a signal containing a drive component and plural read components) into a sensor component transmitted via the sensor port 304 and a downstream component transmitted via the downstream port 306. The wavelength assignment system includes a drive dividing module 310, a read dividing module 320, a drive splitting module 330, a sensor joining module 340, and a drive joining module 350.

The drive dividing module 310 is disposed downstream of the upstream port 302, and is configured to receive the transmitted signal received at the upstream port 302. The drive dividing module 310 separates the read component (e.g., all individual read channel components) from the drive component of the received signal. The read component may be directed downstream to the read dividing module 320, and the drive component may be directed downstream to the drive splitting module 330. For example, the drive component may have a wavelength of about 1500 nanometers, and the plural read channel components may have different wavelengths on the general order of about 1300 nanometers. Thus, the drive dividing module 310 may direct all wavelengths above about 1400 nanometers to the drive splitting module 330, and direct all wavelengths below about 1400 nanometers to the read dividing module 330. The drive dividing module 310, for example, may be configured as a WDM. The wavelengths discussed herein are provided for illustrative purposes, and different wavelength values may be used in various embodiments.

The read dividing module 320 is disposed downstream of the drive dividing module 310. The read dividing module 320 receives the read component from the drive dividing module 310, and separate an individual read channel component associated with or dedicated to a sensor coupled to the sensor port 306 from any other read channel components in the read component. The individual read channel component is directed from the read dividing module 320 to the sensor joining module 340, and the remaining read channel components are directed to the drive joining module 350. The read dividing module 320 may, for example, be configured as a coarse WDM configured to remove a specified bandwidth or wavelength (e.g., about 1310 nanometers) from a received signal. The read dividing module for each wavelength assignment system in a measurement system may be configured to isolate or separate a particular wavelength assigned to a sensor coupled to the sensor port of the particular wavelength assignment system. All of the energy of a particular wavelength may be separated by the read dividing module 320 and directed toward a sensor assigned to or associated with the particular wavelength, in contrast to a splitting that would direct only a proportion (e.g., 10%) of the energy of the wavelength to the sensor.

The drive splitting module 330 is disposed downstream of the drive dividing module 310, and receives the drive component from the drive dividing module 310. The drive splitting module splits the drive component into a sensor portion directed toward the sensor joining module 340 and a drive portion directed toward the drive joining module 350. The drive splitting module 330 may be configured as a splitter or coupler configured to separate a given proportion of light energy received irrespective of wavelength. For example, if the wavelength assignment system 300 is the furthest upstream in a measurement system having 10 sensors, the drive splitting module 330 may be configured as a 90/10 splitter directing 90% of the light energy received to the drive joining module 350 and 10% of the light energy received to the sensor joining module 340. As another example, if the wavelength assignment system 300 is the furthest downstream (e.g., one sensor coupled to sensor port and one sensor coupled to downstream port), the drive splitting module 330 may be configured as a 50/50 splitter directing 50% of the light energy received to the drive joining module 350 and 50% of the light energy received to the sensor joining module 340.

The sensor joining module 340 is disposed downstream of the read dividing module 320 and the drive splitting module 330. The sensor joining module 340 receives the individual read channel component from the read dividing module 320 and the sensor portion of the drive component from the drive splitting module 330, and combines the sensor portion and the individual read channel components into a sensor component transmitted to a sensor 360 via the sensor port 304. The sensor joining module 340 may be configured, for example, as a WDM configured as a joining module to receive a drive component at about 1500 nanometers and a read component at about 1310 nanometers and combine the two to provide an output signal provided to the sensor port 304.

The drive joining module 350 is disposed downstream of the read dividing module 320 and the drive splitting module 330. The drive joining module 350 receives the additional or remainder read channel components (e.g., all received read channel components other than the read channel component assigned to the sensor 360, or the remaining read channel components to be directed downstream) from the read dividing module 320, and receives the downstream portion of the drive component from the drive splitting module. The drive joining module 350 combines the additional or remaining read channel components with the downstream portion of the drive component to provide a downstream signal directed downstream via the downstream port 306.

The wavelength assignment system 300 is also configured to receive reflections of read signals and to combine the reflections into a combined signal transmitted upstream. For example, reflections of particular read channel components may be returned along corresponding paths in the opposite direction as the read components were sent. In the illustrated embodiment, the wavelength assignment system 300 receives reflections from the sensor 360 via the sensor port 304 and reflections from other downstream sensors via the downstream port 306. The wavelength assignment system 300 combines the reflections (e.g., at the read dividing module 320 (which acts as a joining module in the upstream direction)) and provides the reflections upstream via the upstream port 302. It may be noted that the various aspects or components of the wavelength assignment system 300 depicted within the dashed box of FIG. 3 may be provided on a single integrated unit. For example, a wavelength assignment system such as the wavelength assignment system 300 may be configured as a body (e.g., a tube) having disposed therein one or more chips configured to provide the various modules, with the integrated unit including the body spliced into a cable.

The various components or modules of the depicted embodiment describe or define branches and/or paths extending between the upstream port 302 and the sensor port 304 or the downstream port 306 (see also FIG. 2 and related discussion). It may be noted that aspects or portions of branches and/or paths may overlap with portions of other branches and/or paths. As seen in FIG. 3, each branch or path may be understood as beginning or having an upstream terminus at the upstream port 302 or drive dividing module 310.

For example, a sensor drive branch 362 is defined or described from the drive dividing module 310 to the sensor port 304 via the drive splitting module 330 and sensor joining module 340. The sensor portion of the drive component is directed from the upstream port 302 to the sensor port 304 via the sensor drive branch 362. A sensor read branch 364 is defined or described from the drive dividing module 310 to the sensor port 304 via the read dividing module 320 and the sensor joining module 340. An individual read channel component for the sensor 360 is directed from the upstream port 302 to the sensor port 304 via the sensor read branch 364. Together, the sensor drive branch 362 and sensor read branch 364 from a sensor path 366.

A downstream drive branch 372 is defined or described from the drive dividing module 310 to the downstream port 306 via the drive splitting module 330 and the drive joining module 350. The downstream portion of the drive component is directed from the upstream port 302 to the downstream port 306 via the downstream drive branch 372. A downstream read branch 374 is defined or described from the drive dividing module 310 to the downstream port 306 via the read dividing module 320 and the drive joining module 350. One or more read channel components for downstream sensors are directed from the upstream port 302 to the downstream port 306 via the downstream read branch 374. Together, the downstream drive branch 372 and the downstream read branch 374 form a downstream path 376.

Figure 4:
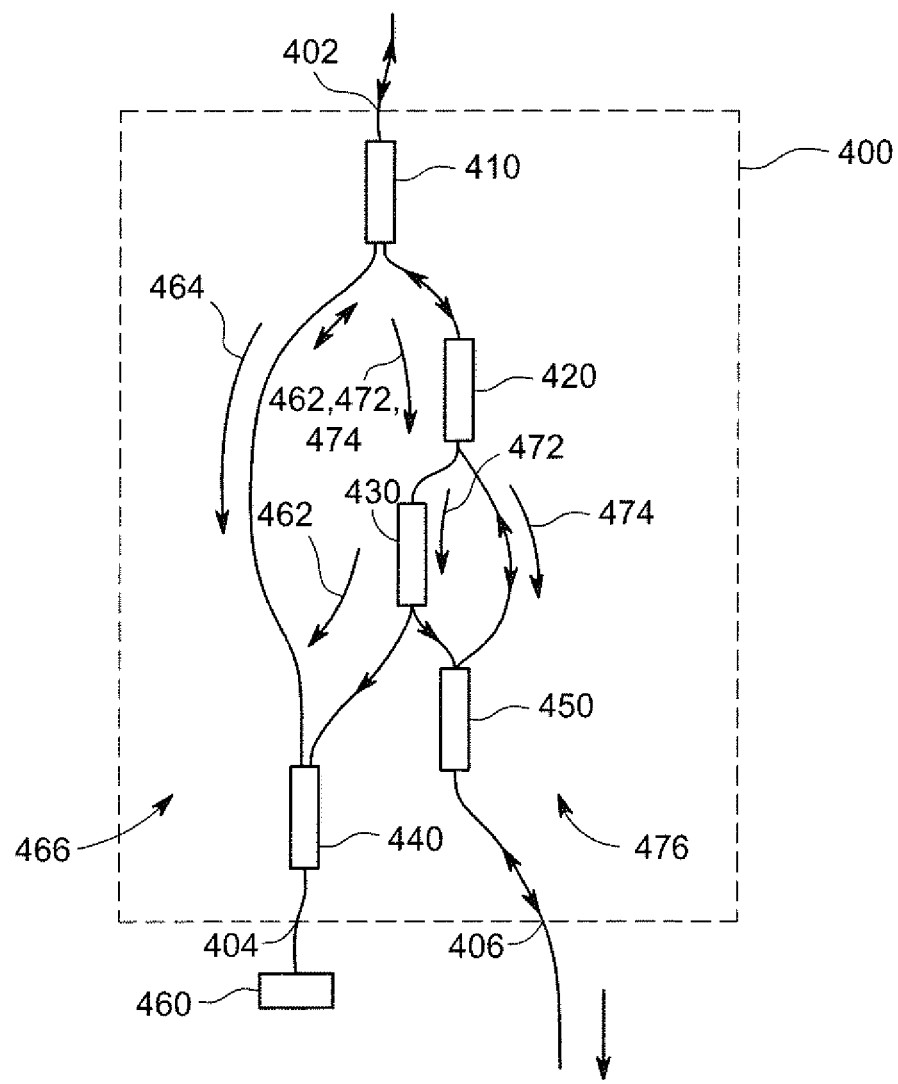
FIG. 4 is a schematic block diagram of a wavelength assignment system in accordance with various embodiments.

It may be noted that, for the embodiments depicted in FIGS. 3 and 4, the various read branches may be understood as bypass branches and the drive branches as splitting branches, where the bypass branches are configured to bypass or avoid splitting modules that divide a light signal irrespective of wavelength, and the splitting branches are configured to include splitting modules. In various embodiments a drive component thus may be split one or more times irrespective of wavelength, whereas read components that may be more sensitive or more negatively affected by splitting may avoid splitting. It may be noted that, in some embodiments, the sensor port 304 may comprise or accept two separate cables (one for a read signal and one for a drive signal) to the sensor 360, and that, for such embodiments, the sensor joining module 340 may be omitted.

FIG. 4 is a schematic view of a wavelength assignment system 400 formed in accordance with various embodiments. The wavelength assignment system 400 may be utilized, for example, as one of the wavelength assignment systems 120, 122, 124, 126 discussed in connection with FIG. 1. The wavelength assignment system 400 may be similar in certain respects to the wavelength assignment system 300 discussed in connection with FIG. 3. For example, the wavelength assignment system 400 includes both splitting modules and dividing modules that direct components of a received signal toward ports via paths and/or branches of paths.

The wavelength assignment system 400 includes an upstream port 402, a sensor port 404, and a downstream port 406. The wavelength assignment system 400 is configured to separate a signal received at the upstream port (e.g., a signal containing a drive component and plural read components) into a sensor component transmitted via the sensor port 404 and a downstream component transmitted via the downstream port 406. The wavelength assignment system includes a read dividing module 410, a drive dividing module 420, a drive splitting module 430, a sensor joining module 440, and a drive joining module 450.

The read dividing module 410 is disposed downstream of the upstream port 402, and receives the transmitted signal via the upstream port 402. The read dividing module 410 separates the individual read channel component for the sensor 460 from a remainder of the transmitted signal (e.g., the drive component and all other read channel components for downstream sensors). The individual read channel component is directed to the sensor joining module 440, and the remainder of the signal is directed to the drive dividing module 420. The read dividing module 410, for example, may be a WDM, such as a coarse WDM (CWDM).

The drive dividing module 420 is disposed downstream of the read dividing module 410 and receives the remainder of the transmitted signal (e.g., the drive component and read channel components for downstream sensors) from the read dividing module 410. The drive dividing module 420 separates the drive component from the read channel component(s), with the drive component directed to the drive splitting module 430, and the read channel component(s) for downstream sensors directed to the drive joining module 450.

The drive splitting module 430 is disposed downstream of the drive dividing module 420 and configured to receive the drive component from the drive dividing module 420. The drive splitting module 430 splits the drive component into the sensor portion of the drive component (which is directed to the sensor joining module 440) and the downstream portion of the drive component (which is directed to the drive joining module 450).

The sensor joining module 440 is disposed downstream of the read dividing module 410 and the drive splitting module 430, and receives the individual read channel component for the sensor 460 from the read dividing module 410 and the sensor portion of the drive component from the drive splitting module 430. The sensor joining module 440 combines the sensor portion and the individual read channel component into the sensor component provided to the sensor 460 via the sensor port 404.

The drive joining module 450 is disposed downstream of the drive dividing module 420 and the drive splitting module 430. The drive joining module 450 receives the read channel component(s) for one or more downstream sensors from the drive dividing module 420, and receives the downstream portion of the drive component from the drive splitting module 430. The drive joining module combines the downstream portion and the at least one additional read channel component into the downstream component provided downstream via the downstream port 406

As seen in FIG. 4, a sensor drive branch 462 is defined or described from the read dividing module 410 to the sensor port 404 via the drive dividing module 420, the drive splitting module 430, and the sensor joining module 440. The sensor portion of the drive component is directed from the upstream port 402 to the sensor port 404 via the sensor drive branch 462. A sensor read branch 464 is defined or described from the read dividing module 410 to the sensor port 404 via the sensor joining module 440. An individual read channel component for the sensor 460 is directed from the upstream port 402 to the sensor port 404 via the sensor read branch 464. Together, the sensor drive branch 462 and sensor read branch 464 from a sensor path 466.

A downstream drive branch 472 is defined or described from the read dividing module 410 to the downstream port 406 via the drive dividing module 420, the drive splitting module 430 and the drive joining module 450. The downstream portion of the drive component is directed from the upstream port 402 to the downstream port 406 via the downstream drive branch 472. A downstream read branch 474 is defined or described from the read dividing module 410 to the downstream port 406 via the drive dividing module 420 and the drive joining module 450. One or more read channel components for downstream sensors are directed from the upstream port 402 to the downstream port 406 via the downstream read branch 474. Together, the downstream drive branch 472 and the downstream read branch 474 form a downstream path 476.

It may be noted that the wavelength assignment system 300 and the wavelength assignment system 400 provide examples of processing circuitry configured to separate a received signal having drive and read components into a sensor component (e.g., a sensor component having a portion of the drive component and an individual read channel component) and a downstream component (e.g., a downstream component having a portion of the drive component and at least one additional individual read channel component).

Figure 5:
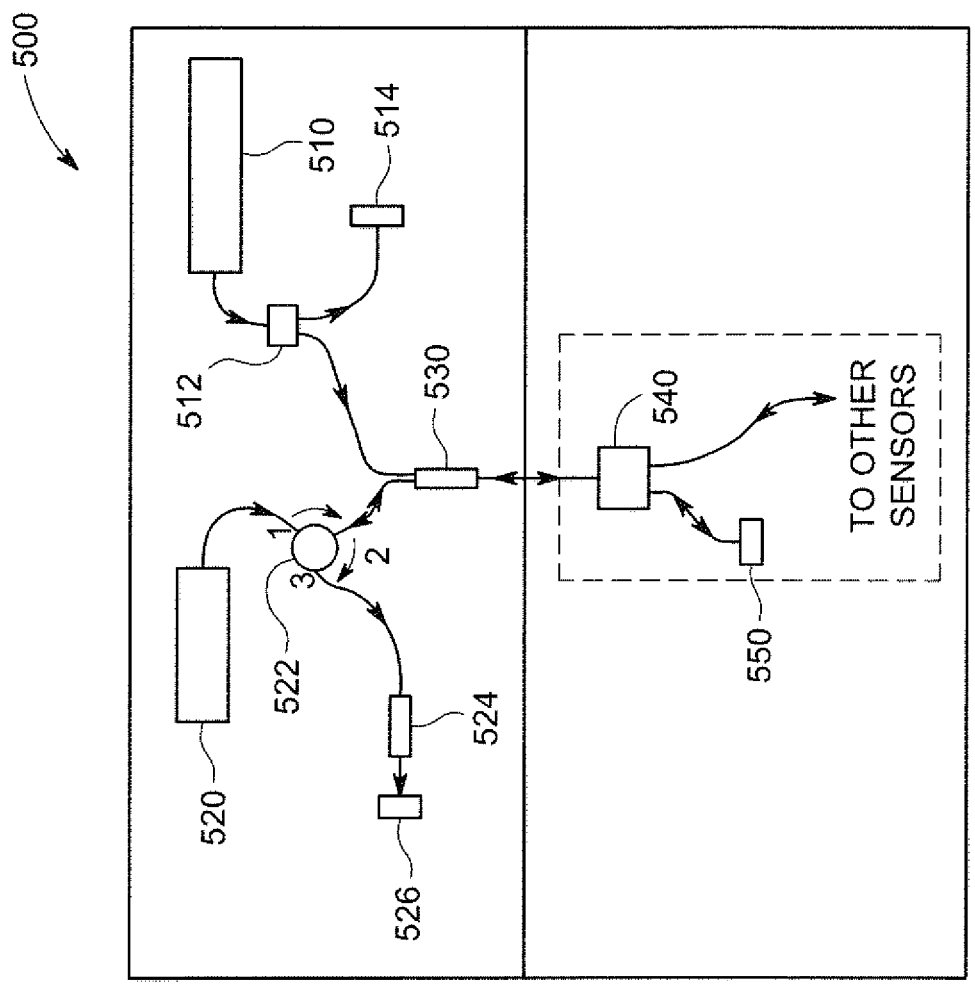
FIG. 5 is a schematic block diagram of a measurement system in accordance with various embodiments.

FIG. 5 provides a schematic view of an example measurement system 500 that includes an excitation or drive laser configured to provide an excitation or drive component of a signal transmitted to plural sensors via a shared cable, and plural read lasers configured to provide read components of the signal. The depicted example measurement system 500 includes an excitation laser 510 (or drive laser), a pulse selection module 512, an absorption module 514, a read laser 520 configured to provide a read signal at a first wavelength (for the sensor 550), a circulator 522, a WDM 524, a detector 526, WDM 530, a wavelength assignment system 540, and a sensor 550. The wavelength assignment system 540 may be configured generally similarly to wavelength assignment systems discussed herein (e.g., wavelength assignment system 200, wavelength assignment system 300, wavelength assignment system 400), and is configured to provide a sensor component of a received signal (e.g., received via the WDM 530. The system 500 may also include additional read lasers and related components (generally similar to the first read laser 520 and related components) configured at other wavelengths for use with additional sensors disposed downstream of the sensor 550.

The excitation laser 510 is configured to provide an excitation or drive portion of a transmitted signal (e.g., in some embodiments, a pulsed signal), and the read laser 520 is configured to provide a read portion of the transmitted signal, with the reflections of the read portion used to identify one or more resonant frequencies of the sensor 550. The wavelengths of the read laser 520 and the excitation laser 510 may be different in the illustrated embodiment. It may be noted that other types of excitation lasers or signals may be employed in alternate embodiments.

In the depicted example, the excitation laser 510 has an average output power of about 250 milliWatts, a wavelength of about 1550 nanometers, and pulse repetition rate of about 10 kHz. Because 10 kHz may be too rapid of a rate to allow for effective reading of reflections during a ring down period between delivery of the high energy pulses (in embodiments utilizing a pulsed signal), the pulse selection module 512 may be employed to selectively pick pulses allowed to travel to the sensor 550 (and/or any other sensors), and to discard other pulses. For example, the pulse selection module 512 may be an acoustic optical (AO) modulator configured to allow certain pulses to travel to the sensor 550 (via the WDM 530) and other pulses to the absorption module 514, which may be understood as a beam dump. The excitation laser provides a pulse of relatively high energy at a desired pulse interval to the sensor 550 via the WDM 530.

The depicted read laser 520, for example, may be a diode laser having a wavelength of about 1310 nanometers, which may be provided at a constant relatively low power level. The energy produced by the read laser 520 is directed to the WDM 530 via the circulator 522, and combined with the pulse from the excitation laser 510 by the WDM 530. Energy at different wavelengths from additional read lasers may also be directed to the WDM 530.

The combined signal produced by the excitation laser 510 and the read laser 520 travels along a fiber optic cable from the WDM 530 to the wavelength assignment system 540, which separates a portion of the combined signal to the sensor 550, and the remainder to one or more additional downstream sensors (not shown). In some embodiments, absorption of the drive component (or a portion thereof) of the transmitted signal causes a resonator of the sensor 550 to heat and expand, which in turn causes the resonator to begin vibrating at the various eigenmodes of the resonator. The resonator may form one mirror of an optical cavity, with additional reflections coming from non-vibrating surfaces in the optical path, for example inner and outer surfaces of a cap of a die of the sensor 550. The low power signal from the read laser 520 is reflected from the optical cavity, and the amplitude is modulated by the vibrating resonator inside the cavity. The reflected light may be detected (e.g., by the detector 526) and used to determine the resonant frequencies of the sensor 550.

The reflections from the sensor 550 may travel from the wavelength assignment system 540 to the WDM 530 which separates reflections along the 1310 nanometer wavelength to the circulator 522, from where the separated reflections travel to the detector 526 via the WDM 524.

Figure 6:
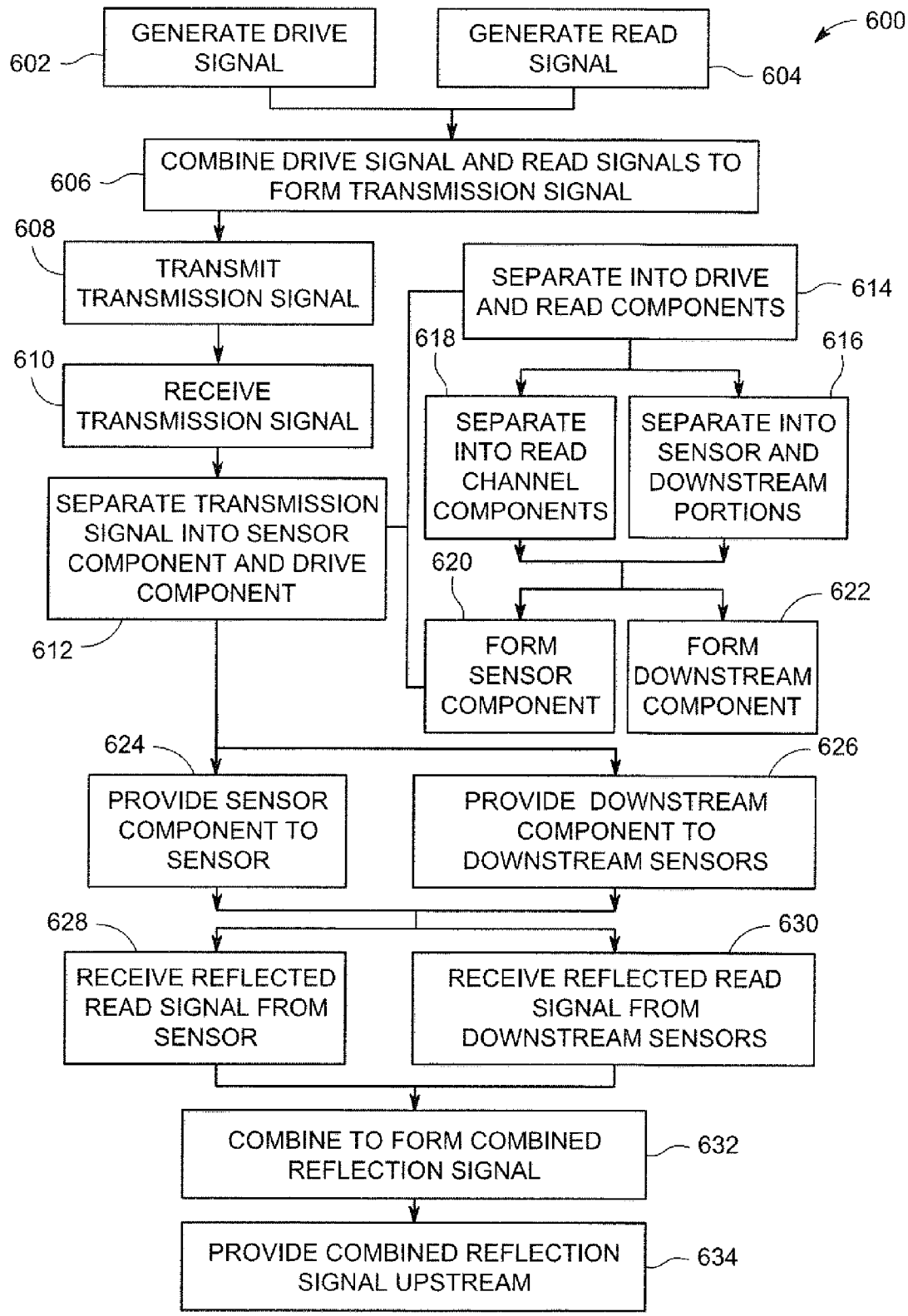
FIG. 6 is a flowchart of a method in accordance with various embodiments.

FIG. 6 provides a flowchart of a method 600 for determining pressure and/or temperature, for example temperature and/or pressure of one or more locations of a remote environment in which one or more sensors are disposed. In various embodiments, the method 600, for example, may employ structures or aspects of various embodiments (e.g., systems and/or methods) discussed herein. In various embodiments, certain steps may be omitted or added, certain steps may be combined, certain steps may be performed simultaneously, certain steps may be performed concurrently, certain steps may be split into multiple steps, certain steps may be performed in a different order, or certain steps or series of steps may be re-performed in an iterative fashion. In various embodiments, portions, aspects, and/or variations of the method 600 may be able to be used as one or more algorithms to direct hardware to perform operations described herein.

At 602, a drive signal at a drive wavelength is generated to provide a drive component of a signal to be transmitted downstream to excite one or more sensors. At 604, a plurality of read signals (or read channel components) are generated at a corresponding plurality of wavelengths. Each read signal may be generated by a read laser having a wavelength dedicated to or associated with a particular sensor disposed in a remote environment. At 606, the drive signal and plurality of read signals are combined to form a transmission signal. At 608, the transmission signal is transmitted (e.g., via a fiber optic cable) to a remote environment.

At 610, the transmitted signal is received, for example, by a wavelength assignment system (e.g., wavelength assignment system 100, wavelength assignment system 200, wavelength assignment system 300, wavelength assignment system 400) associated with and coupled to a particular sensor disposed along the fiber optic cable within the remote environment. The transmitted signal may be received, for example, at an upstream port of the wavelength assignment system.

At 612, the transmitted signal is separated into a sensor component and a downstream component. For example, at 614, the transmitted signal may be separated into the drive component and the read component. At 616, the drive component of the signal received at 610 may be separated into a sensor portion (for a sensor coupled to the wavelength assignment system receiving the signal at 610) and a downstream portion (for downstream sensors). At 618, the read component may be separated into an individual read channel components (at a wavelength corresponding to the sensor coupled to the wavelength assignment system receiving the signal at 610) and one or more additional read channel components (for downstream sensors). At 620, the sensor portion and the individual read channel component may be combined to form the sensor component. At 622, the drive portion and the one or more additional read channel components may be combined to farm the downstream portion. It may be noted that substeps 614-622 are provided by way of example, and that different steps or substeps may be used alternatively to substeps 614-622.

At 624, the sensor component is provided to a sensor, for example via a sensor port. At 626, the downstream component is provided to one or more downstream sensors, for example via a downstream port coupled to a length of fiber optic cable extending downstream. The downstream sensors may be coupled to the cable, for example, via additional wavelength assignment systems.

The signals transmitted to the sensors result in reflections from the sensors that may be collected and read to determine one or more properties or characteristics of the sensors (e.g., resonant frequencies of the sensors). For example, at 628, reflections of a read signal transmitted to the sensor receiving the sensor component are received. The reflections may be received at the sensor port of the wavelength assignment system. At 630, reflections of read signals transmitted to downstream sensors are received. The reflections from downstream sensor may be received at the downstream port.

At 632, the reflections from the sensor and the downstream sensors are combined into a combined reflection signal, for example, using one or more WDMs of the wavelength assignment system. At 634, the combined reflection signal is provided upstream (e.g., to one or more detectors and/or an interrogation unit configured to determine resonant frequencies of one or more sensors based on the reflections). The combined reflection may be provided, for example, via the upstream port of the wavelength assignment system. With the resonant frequencies for the various sensor determined, the resonant frequencies may then be used to determine temperature and/or pressure at locations within the remote environment associated with the sensors.

It should be noted that the particular arrangement of components (e.g., the number, types, placement, or the like) of the illustrated embodiments may be modified in various alternate embodiments. In various embodiments, different numbers of a given module or unit may be employed, a different type or types of a given module or unit may be employed, a number of modules or units (or aspects thereof) may be combined, a given module or unit may be divided into plural modules (or sub-modules) or units (or sub-units), a given module or unit may be added, or a given module or unit may be omitted.

It should be noted that the various embodiments may be implemented in hardware, software or a combination thereof. The various embodiments and/or components, for example, the modules, or components and controllers therein, also may be implemented as part of one or more computers or processors. The computer or processor may include a computing device, an input device, a display unit and an interface, for example, for accessing the Internet. The computer or processor may include a microprocessor. The microprocessor may be connected to a communication bus. The computer or processor may also include a memory. The memory may include Random Access Memory (RAM) and Read Only Memory (ROM). The computer or processor further may include a storage device, which may be a hard disk drive or a removable storage drive such as a solid state drive, optical drive, and the like. The storage device may also be other similar means for loading computer programs or other instructions into the computer or processor.

As used herein, the term "computer," "controller," and "module" may each include any processor-based or microprocessor-based system including systems using microcontrollers, reduced instruction set computers (RISC), application specific integrated circuits (ASICs), logic circuits, GPUs, FPGAs, and any other circuit or processor capable of executing the functions described herein. The above examples are exemplary only, and are thus not intended to limit in any way the definition and/or meaning of the term "module" or "computer."

The computer, module, or processor executes a set of instructions that are stored in one or more storage elements, in order to process input data. The storage elements may also store data or other information as desired or needed. The storage element may be in the form of an information source or a physical memory element within a processing machine.

The set of instructions may include various commands that instruct the computer, module, or processor as a processing machine to perform specific operations such as the methods and processes of the various embodiments described and/or illustrated herein. The set of instructions may be in the form of a software program. The software may be in various forms such as system software or application software and which may be embodied as a tangible and non-transitory computer readable medium. Further, the software may be in the form of a collection of separate programs or modules, a program module within a larger program or a portion of a program module. The software also may include modular programming in the form of object-oriented programming. The processing of input data by the processing machine may be in response to operator commands, or in response to results of previous processing, or in response to a request made by another processing machine.

As used herein, the terms "software" and "firmware" are interchangeable, and include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program. The individual components of the various embodiments may be virtualized and hosted by a cloud type computational environment, for example to allow for dynamic allocation of computational power, without requiring the user concerning the location, configuration, and/or specific hardware of the computer system.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112(f), unless and until such claim limitations expressly use the phrase "means for" followed by a statement of function void of further structure.

This written description uses examples to disclose the various embodiments, and also to enable a person having ordinary skill in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal languages of the claims.

What is claimed is:

1. A wavelength assignment system comprising:
an upstream port configured to receive a transmitted signal sent from an upstream location to a downstream location and to provide a reflected signal of at least a portion of the transmitted signal, the transmitted signal including light from a plurality of laser wavelengths, the transmitted signal including a drive component at a drive wavelength and a read component comprising individual read channel components at corresponding individual read wavelengths;
a sensor port disposed downstream of the upstream port and configured to provide a sensor component of the transmitted signal to a sensor and to receive a reflection of at least a portion of the sensor component from the sensor, the sensor component comprising a sensor portion of the drive component and substantially all of an individual read channel component of the read component corresponding to the sensor; and a downstream port disposed downstream of the upstream port and configured to provide a downstream component of the transmitted signal to at least one additional sensor disposed downstream of the sensor, and to receive a reflection signal of at least a portion of the downstream component from the at least one additional sensor, the downstream component comprising a downstream portion of the drive component and substantially all of at least one additional read channel component corresponding to the at least one additional sensor;

wherein the wavelength assignment system is configured to receive the transmitted signal and separate the transmitted signal into the sensor component and the downstream component, further comprising:

a drive dividing module disposed downstream of the upstream port, the dividing module configured to receive the transmitted signal and to separate the transmitted read component of the transmitted signal from the drive component of the transmitted signal;

a read dividing module disposed downstream of the drive dividing module and configured to receive the read component from the drive dividing module, and to separate the individual read channel component corresponding to the sensor from the at least one additional read channel component;

a drive splitting module disposed downstream of the drive dividing module and configured to receive the drive component from the drive dividing module, and to split the drive component into the sensor portion of the drive component and the downstream portion of the drive component; and a drive joining module disposed downstream of the read dividing module and the drive splitting module, and configured to receive the at least one additional read channel component from the read dividing module, to receive the downstream portion of the drive component from the drive splitting module, and to combine the downstream portion and the at least one additional read channel component into the downstream component.

2. A wavelength assignment system comprising:

an upstream port configured to receive a transmitted signal sent from an upstream location to a downstream location and to provide a reflected signal of at least a portion of the transmitted signal, the transmitted signal including light from a plurality of laser wavelengths, the transmitted signal including a drive component at a drive wavelength and a read component comprising individual read channel components at corresponding individual read wavelengths;

a sensor port disposed downstream of the upstream port and configured to provide a sensor component of the transmitted signal to a sensor and to receive a reflection of at least a portion of the sensor component from the sensor, the sensor component comprising a sensor portion of the drive component and substantially all of an individual read channel component of the read component corresponding to the sensor; and a downstream port disposed downstream of the upstream port and configured to provide a downstream component of the transmitted signal to at least one additional sensor disposed downstream of the sensor, and to receive a reflection signal of at least a portion of the downstream component from the at least one additional sensor the downstream component comprising a downstream portion of the drive component and substantially all of at least one additional read channel component corresponding to the at least one additional sensor;

wherein the wavelength assignment system is configured to receive the transmitted signal and separate the transmitted signal into the sensor component and the downstream component, further comprising:

a read dividing module disposed downstream of the upstream port and configured to receive the transmitted signal, and to separate the individual read channel component from a remainder of the transmitted signal, the remainder of the transmitted signal comprising the drive component and the at least one additional read channel component;

a drive dividing module disposed downstream of the read dividing module and configured to receive the remainder of the transmitted signal from the read dividing module, and to separate the drive component from the at least one additional read channel component;

a drive splitting module disposed downstream of the drive dividing module and configured to receive the drive component front the drive dividing module, and to split the drive component into the sensor portion of the drive component and the downstream portion of the drive component; and a drive joining module disposed downstream of the drive dividing module and the drive splitting module, and configured to receive the at least one additional read channel component from the drive dividing module, to receive the downstream portion of the drive component from the drive splitting module, and to combine the downstream portion and the at least one additional read channel component into the downstream component.

3. A measurement system including:

a laser source module including a drive laser and a plurality of read lasers, the laser source module configured to provide an output of the drive laser and the plurality of read lasers via a shared cable in a downstream direction;

a plurality of sensors operably coupled to the shared cable, each of the sensors disposed downstream of the laser source and configured to receive an output of a corresponding read laser; and a wavelength assignment system operably coupled to the shared cable, the wavelength assignment system configured to receive a transmitted signal including a drive component at a drive wavelength and a read component comprising individual read channel components at corresponding individual read wavelengths from the laser source module, to separate the transmitted signal into a sensor component and a downstream component, to provide the sensor component to a dedicated sensor of the plurality of sensors associated with the wavelength assignment system, and to provide the downstream component to at least one additional sensor disposed downstream of the wavelength assignment system, wherein the wavelength assignment system comprises:

an upstream port configured to receive the transmitted signal from the laser source module and to provide a reflected signal of at least a portion of the transmitted signal to the laser source module;

a sensor port disposed downstream of the upstream port and configured to provide the sensor component of the transmitted signal to the dedicated sensor and to receive a reflection of at least a portion of the sensor component from the dedicated sensor, the sensor component comprising a sensor portion of the drive component and substantially all of an individual read channel component of the read component corresponding to the dedicated sensor; and a downstream port disposed downstream of the upstream port and configured to provide a downstream component of the transmitted signal to the at least one additional sensor, and to receive a reflection signal of at least a portion of the downstream component from the at least one additional sensor, the downstream component comprising a downstream portion of the drive component and substantially all of at least one additional read channel component corresponding to the at least one additional sensor.

4. The measurement system of claim 3, wherein the wavelength assignment system further comprises:

a sensor path extending between the upstream port and the sensor port, the sensor path comprising a sensor drive branch and a sensor read branch, the sensor drive branch configured to direct the sensor portion of the transmitted drive component to the sensor port, the sensor read branch configured to direct the individual read channel component corresponding to the sensor to the sensor port; and a downstream path extending between the upstream port and the downstream port, the downstream path comprising a downstream drive branch and a downstream read branch, the downstream drive path configured to direct the downstream portion of the drive component to the downstream port, the downstream read branch configured to direct the at least one additional read channel component corresponding to the at least one additional sensor to the downstream port.

5. The measurement system of claim 3, wherein the wavelength assignment system further comprises:

a drive dividing module disposed downstream of the upstream port, the dividing module configured to receive the transmitted signal and to separate the transmitted read component of the transmitted signal from the drive component of the transmitted signal;

a read dividing module disposed downstream of the drive dividing module and configured to receive the read component from the drive dividing module, and to separate the individual read channel component corresponding to the sensor from the at least one additional read channel component;

a drive splitting module disposed downstream of the drive dividing module and configured to receive the drive component from the drive dividing module, and to split the drive component into the sensor portion of the drive component and the downstream portion of the drive component; and a drive joining module disposed downstream of the read dividing module and the drive splitting module, and configured to receive the at least one additional read channel component from the read dividing module, to receive the downstream portion of the drive component from the drive splitting module, and to combine the downstream portion and the at least one additional read channel component into the downstream component.

6. The measurement system of claim 3, wherein the wavelength assignment system further comprises:

a read dividing module disposed downstream of the upstream port and configured to receive the transmitted signal, and to separate the individual read channel component from a remainder of the transmitted signal, the remainder of the transmitted signal comprising the drive component and the at least one additional read channel component;

a drive dividing module disposed downstream of the read dividing module and configured to receive the remainder of the transmitted signal from the read dividing module, and to separate the drive component from the at least one additional read channel component;

a drive splitting module disposed downstream of the drive dividing module and configured to receive the drive component from the drive dividing module, and to split the drive component into the sensor portion of the drive component and the downstream portion of the drive component; and a drive joining module disposed downstream of the drive dividing module and the drive splitting module, and configured to receive the at least one additional read channel component from the drive dividing module, to receive the downstream portion of the drive component from the drive splitting module, and to combine the downstream portion and the at least one additional read channel component into the downstream component.

7. The measurement system of claim 3, wherein the sensor port is configured to provide the sensor component via a read cable and a drive cable, the read cable configured to provide the individual read channel component to the sensor, the drive cable configured to provide the sensor portion of the drive component to the sensor.

8. The measurement system of claim 3, wherein the sensor port is configured to provide the sensor component via a combined cable configured to provide the sensor portion of the drive component and the individual read channel component to the sensor.

9. The measurement system of claim 3, wherein the wavelength assignment system is configured as an integrated unit spliced into the shared cable.

10. The measurement system of claim 3, wherein the at least one sensor includes a micro-electromechanical system (MEMS) sensor.

11. The wavelength assignment system of claim 1, further comprising:

a sensor path extending between the upstream port and the sensor port, the sensor path comprising a sensor drive branch and a sensor read branch, the sensor drive branch configured to direct the sensor portion of the transmitted drive component to the sensor port, the sensor read branch configured to direct the individual read channel component corresponding to the sensor to the sensor port; and a downstream path extending between the upstream port and the downstream port, the downstream path comprising a downstream drive branch and a downstream read branch, the downstream drive path configured to direct the downstream portion of the drive component to the downstream port, the downstream read branch configured to direct the at least one additional read channel component corresponding to the at least one additional sensor to the downstream port.

12. The wavelength assignment system of claim 1, wherein the sensor port is configured to provide the sensor component via a read cable and a drive cable, the read cable configured to provide the individual read channel component to the sensor, the drive cable configured to provide the sensor portion of the drive component to the sensor.

13. The wavelength assignment system of claim 1, wherein the sensor port is configured to provide the sensor component via a combined cable configured to provide the sensor portion of the drive component and the individual read channel component to the sensor.

14. The wavelength assignment system of claim 2, further comprising:
- a sensor path extending between the upstream port and the sensor port, the sensor path comprising a sensor drive branch and a sensor read branch, the sensor drive branch configured to direct the sensor portion of the transmitted drive component to the sensor port, the sensor read branch configured to direct the individual read channel component corresponding to the sensor to the sensor port; and
- a downstream path extending between the upstream port and the downstream port, the downstream path comprising a downstream drive branch and a downstream read branch, the downstream drive path configured to direct the downstream portion of the drive component to the downstream port, the downstream read branch configured to direct the at least one additional read channel component corresponding to the at least one additional sensor to the downstream port.

15. The wavelength assignment system of claim 2, wherein the sensor port is configured to provide the sensor component via a read cable and a drive cable, the read cable configured to provide the individual read channel component to the sensor, the drive cable configured to provide the sensor portion of the drive component to the sensor.

16. The wavelength assignment system of claim 2, wherein the sensor port is configured to provide the sensor component via a combined cable configured to provide the sensor portion of the drive component and the individual read channel component to the sensor.

* * * * *